United States Patent
Pagaila et al.

(10) Patent No.: US 8,236,617 B2
(45) Date of Patent: Aug. 7, 2012

(54) SEMICONDUCTOR DEVICE AND METHOD OF FORMING THERMALLY CONDUCTIVE LAYER BETWEEN SEMICONDUCTOR DIE AND BUILD-UP INTERCONNECT STRUCTURE

(75) Inventors: Reza A. Pagaila, Singapore (SG); Yaojian Lin, Singapore (SG); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 189 days.

(21) Appl. No.: 12/794,612

(22) Filed: Jun. 4, 2010

(65) Prior Publication Data

US 2011/0298110 A1    Dec. 8, 2011

(51) Int. Cl.
*H01L 23/488* (2006.01)
*H01L 23/552* (2006.01)
*H01L 23/36* (2006.01)
*H01L 21/60* (2006.01)

(52) U.S. Cl. . 438/122; 438/124; 257/660; 257/E21.499; 257/E21.506; 257/E23.114; 257/E23.101

(58) Field of Classification Search .......... 257/660, 257/E21.499, E21.506, E23.114, E23.023, 257/E23.101; 438/122, 124

See application file for complete search history.

(56) References Cited

U.S. PATENT DOCUMENTS

| | | | |
|---|---|---|---|
| 5,250,843 | A | 10/1993 | Eichelberger |
| 5,353,498 | A | 10/1994 | Fillion et al. |
| 5,841,193 | A | 11/1998 | Eichelberger |
| 6,838,776 | B2 | 1/2005 | Leal et al. |
| 7,180,181 | B2 | 2/2007 | Liu et al. |
| 7,214,887 | B2 | 5/2007 | Higashida et al. |
| 7,416,923 | B2 | 8/2008 | Matsumoto |
| 7,619,901 | B2 | 11/2009 | Eichelberger et al. |
| 7,842,607 | B2 * | 11/2010 | Tay et al. ................. 438/637 |
| 2007/0210427 | A1 | 9/2007 | Lytle et al. |
| 2008/0006949 | A1 | 1/2008 | Lee et al. |
| 2009/0127703 | A1 | 5/2009 | Lee |

* cited by examiner

*Primary Examiner* — Benjamin Sandvik
*Assistant Examiner* — Whitney T Moore
(74) *Attorney, Agent, or Firm* — Robert D. Atkins; Patent Law Group: Atkins & Associates, P.C.

(57) ABSTRACT

A semiconductor device has a thermally conductive layer with a plurality of openings formed over a temporary carrier. The thermally conductive layer includes electrically non-conductive material. A semiconductor die has a plurality of bumps formed over contact pads on the die. The semiconductor die is mounted over the thermally conductive layer so that the bumps are disposed at least partially within the openings in the thermally conductive layer. An encapsulant is deposited over the die and thermally conductive layer. The temporary carrier is removed to expose the bumps. A first interconnect structure is formed over the encapsulant, semiconductor die, and bumps. The bumps are electrically connected to the first interconnect structure. A heat sink or shielding layer can be formed over the semiconductor die. A second interconnect structure can be formed over the encapsulant and electrically connected to the first interconnect structure through conductive vias formed in the encapsulant.

25 Claims, 9 Drawing Sheets

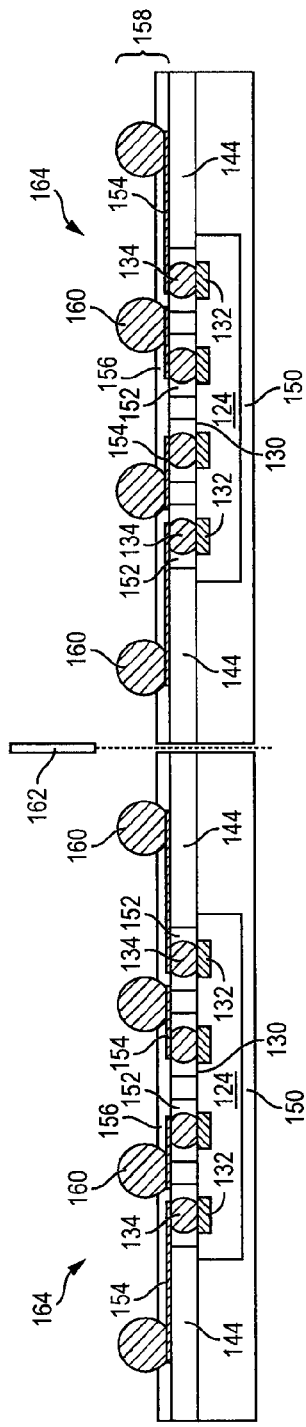
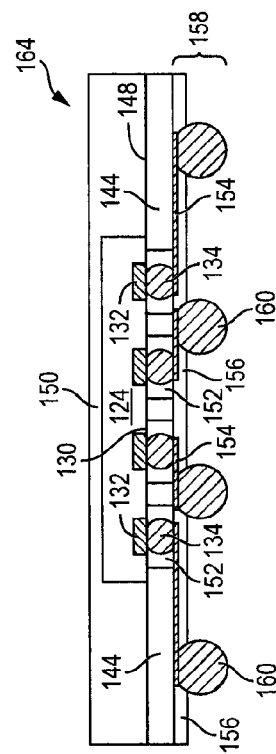
FIG. 4j
FIG. 5

SEMICONDUCTOR DEVICE AND METHOD OF FORMING THERMALLY CONDUCTIVE LAYER BETWEEN SEMICONDUCTOR DIE AND BUILD-UP INTERCONNECT STRUCTURE

FIELD OF THE INVENTION

The present invention relates in general to semiconductor devices and, more particularly, to a semiconductor device and method of forming a thermally conductive layer between a semiconductor die and build-up interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (FO-WLCSP), a semiconductor die is typically electrically connected to a build-up interconnect structure and covered by an encapsulant. The encapsulant is disposed between a majority of the surface area between the semiconductor die and build-up interconnect structure. The encapsulant is often thermally non-conductive so heat generated by the semiconductor die is not effectively dissipated through the interconnect structure. Without effective heat dissipation, the generated heat can reduce performance, decrease reliability, and reduce the useful lifetime of the semiconductor device.

In addition, any mismatch in the coefficient of thermal expansion (CTE) between the encapsulant, semiconductor die, and build-up interconnect structure induces thermal stress which can cause defects in the interconnect joints. The thermal stress can also cause warpage during encapsulation or after the package is completely formed. An underfill material beneath the semiconductor die can absorb stress; however, the underfill material is typically thermally non-conductive so heat dissipation remains an issue.

The semiconductor die are known to shift during encapsulation. One solution to die shifting is to form wettable contact pads over a temporary carrier. The die bumps are bonded to the wettable contact pads to reduce die shifting during encapsulation. However, forming the wettable contact pads increases contact resistance, reduces electrical performance, and increases manufacturing costs.

As the dimensions of the semiconductor die become smaller and demands for higher pin count increases, the bump size and pitch must be reduced. The smaller bumps increase void formation since the gap between the semiconductor die and temporary carrier is too narrow to allow uniform underfilling.

SUMMARY OF THE INVENTION

A need exists to dissipate heat from a semiconductor die, as well as provide for minimal interconnect resistance. Accordingly, in one embodiment, the present invention is a method of making a semiconductor device comprising the steps of providing a temporary carrier and forming a thermally conductive layer over the temporary carrier. The thermally conductive layer includes electrically non-conductive material. The method further includes the steps of forming a plurality of openings in the thermally conductive layer, providing a semiconductor die having a plurality of bumps formed over contact pads on the semiconductor die, mounting the semiconductor die over the thermally conductive layer so that the bumps are disposed at least partially within the openings in the thermally conductive layer, depositing an encapsulant over the semiconductor die and thermally conductive layer, removing the temporary carrier to expose the bumps, and forming an interconnect structure over the encapsulant, semiconductor die, and bumps. The bumps are electrically connected to the interconnect structure.

In another embodiment, the present invention is a method of making a semiconductor device comprising the steps of providing a carrier, forming a thermally conductive layer having a plurality of openings over the carrier, providing a semiconductor die having a plurality of bumps formed over contact pads on the semiconductor die, mounting the semiconductor die over the thermally conductive layer so that the bumps are disposed within the openings in the thermally conductive layer, depositing an encapsulant over the semiconductor die and thermally conductive layer, removing the carrier, and forming an interconnect structure over the encapsulant and semiconductor die. The bumps are electrically connected to the interconnect structure.

In another embodiment, the present invention is a method of making a semiconductor device comprising the steps of providing a thermally conductive layer having a plurality of openings, mounting a semiconductor die having a plurality of bumps over the thermally conductive layer so that the bumps are disposed within the openings in the thermally conductive layer, depositing an encapsulant over the semiconductor die and thermally conductive layer, and forming an interconnect structure over the encapsulant and semiconductor die. The bumps are electrically connected to the interconnect structure.

In another embodiment, the present invention is a semiconductor device comprising a thermally conductive layer having a plurality of openings. A semiconductor die having a plurality of bumps is mounted over the thermally conductive layer so that the bumps are disposed within the openings in the thermally conductive layer. An encapsulant is deposited over the semiconductor die and thermally conductive layer. An interconnect structure is formed over the encapsulant and semiconductor die. The bumps are electrically connected to the interconnect structure.

BRIEF DESCRIPTION OF THE DRAWINGS

FIGS. 4a-4j illustrate a process of forming a thermally conductive layer between a semiconductor die and build-up interconnect structure;

FIG. 5 illustrates a WLCSP with the thermally conductive layer disposed between the semiconductor die and interconnect structure;

DETAILED DESCRIPTION OF THE DRAWINGS

Figure 1:
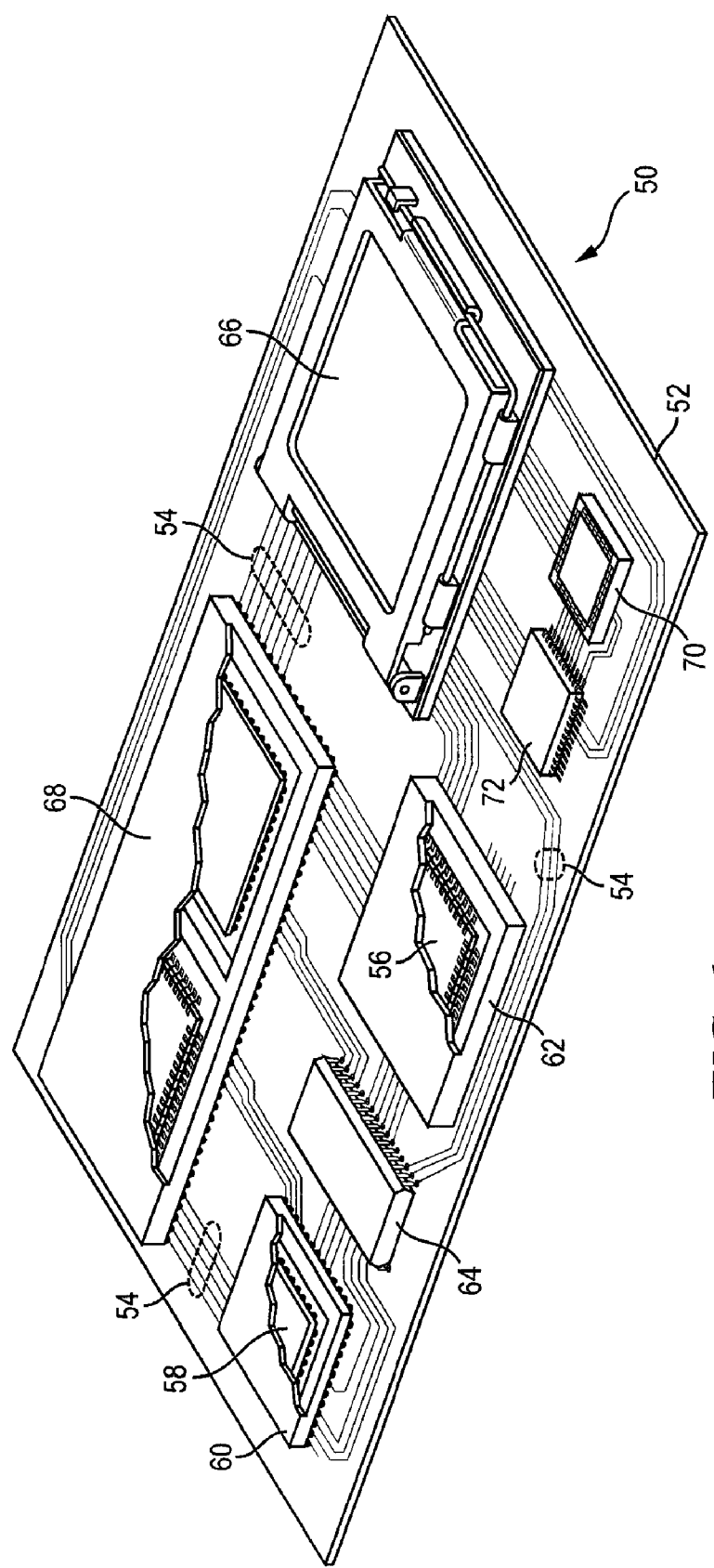
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
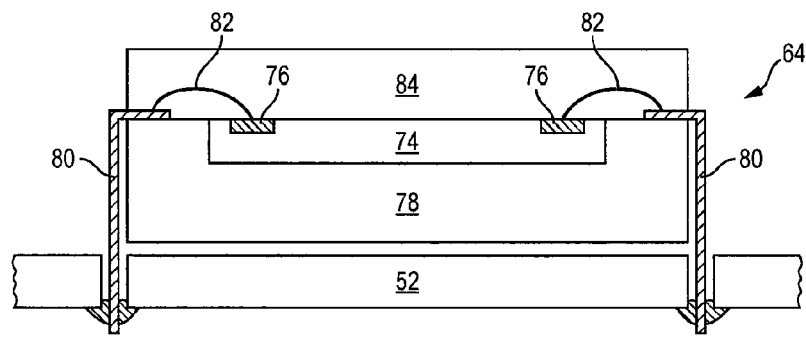
FIGS. 2a-2c illustrate further detail of the representative semiconductor packages mounted to the PCB.
Figure 2B:
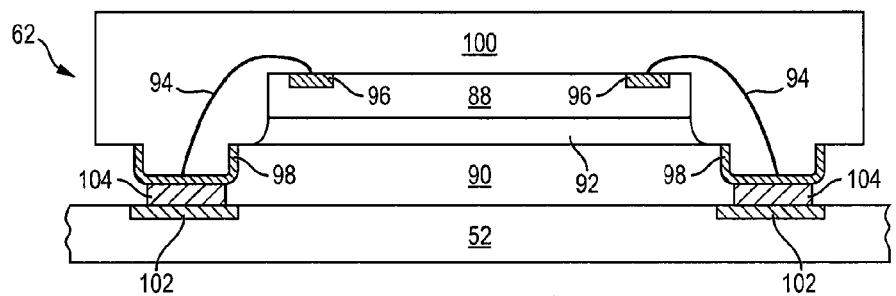
Figure 2C:
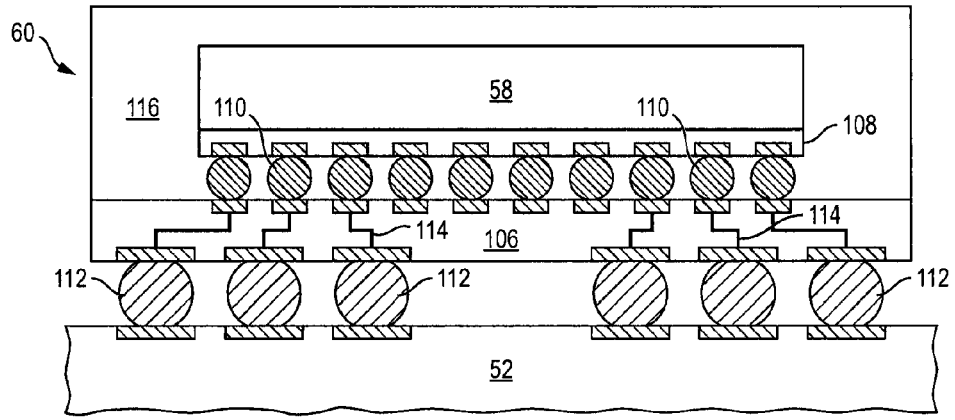

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
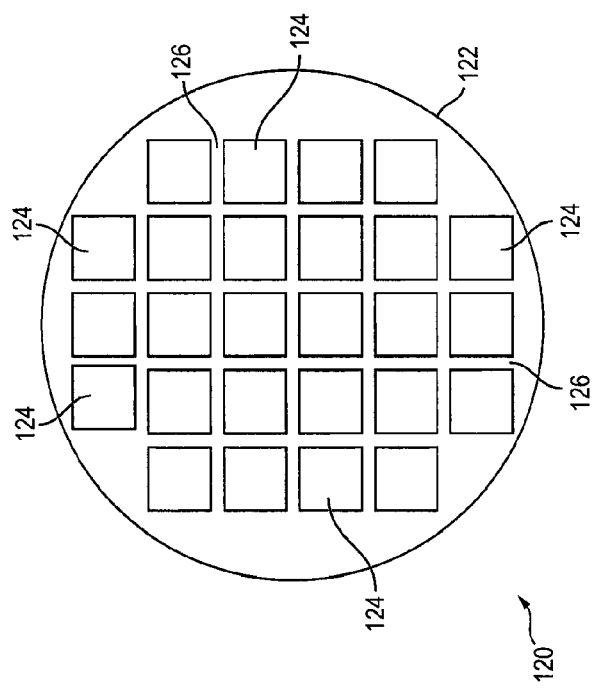
FIGS. 3a-3c illustrate a semiconductor wafer containing a plurality of semiconductor die.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
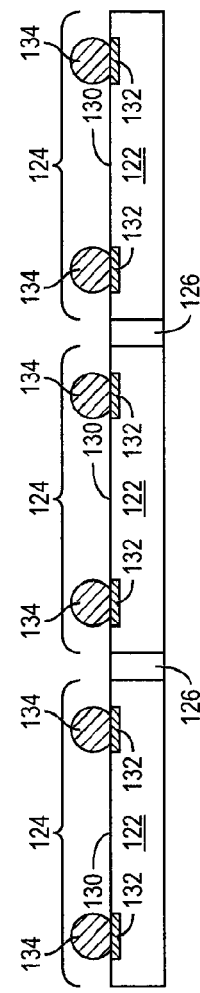

FIG. 3b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer operates as contact pads electrically connected to the circuits on active surface 130.

An electrically conductive bump material is deposited over contact pads 132 while in wafer form using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form spherical balls or bumps 134. In some applications, bumps 134 are reflowed a second time to improve electrical contact to contact pads 132. The bumps can also be compression bonded to contact pads 132.

Figure 3C:
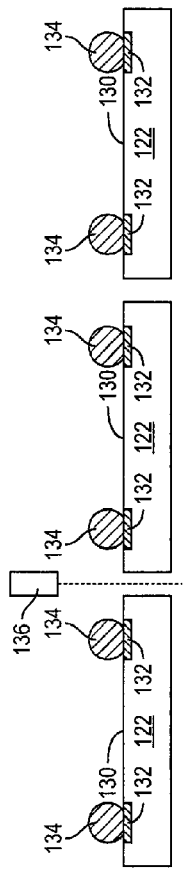

In FIG. 3c, semiconductor wafer 120 is singulated through saw street 126 using saw blade or laser cutting tool 136 into individual semiconductor die 124.

Figure 4A:

FIGS. 4a-4j illustrate, in relation to FIGS. 1 and 2a-2c, a process of forming a thermally conductive layer between a semiconductor die and build-up interconnect structure. In FIG. 4a, a temporary carrier or substrate 140 contains sacrificial base material such as silicon, polymer, polymer composite, metal, ceramic, glass, glass epoxy, beryllium oxide, or other suitable low-cost, rigid material or bulk semiconductor material for structural support. An optional interface layer or double-sided tape 142 can be formed over carrier 140 as a temporary adhesive bonding film or etch-stop layer.

Figure 4B:
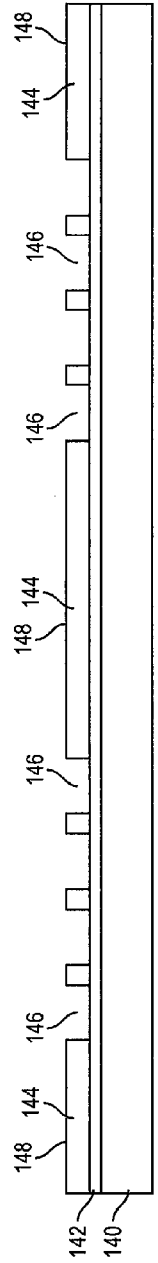

In FIG. 4b, a thermally conductive layer 144 is formed over interface layer 142. Thermally conductive layer 144 can be aluminum oxide, beryllium oxide, thermal interface material (TIM), bakelite, anodized aluminum sheet, or sheet of copper or aluminum with a thin insulating coating formed by screen printing or other suitable deposition process. Thermally conductive material 144 is electrically non-conductive and has a CTE similar to the CTE of semiconductor die 124. A plurality of openings 146 is formed through top surface 148 of thermally conductive layer 144 down to interface layer 142 using an etching process. Alternatively, a preformed thermally conductive sheet with a plurality of holes can be mounted to interface layer 142.

Figure 4C:
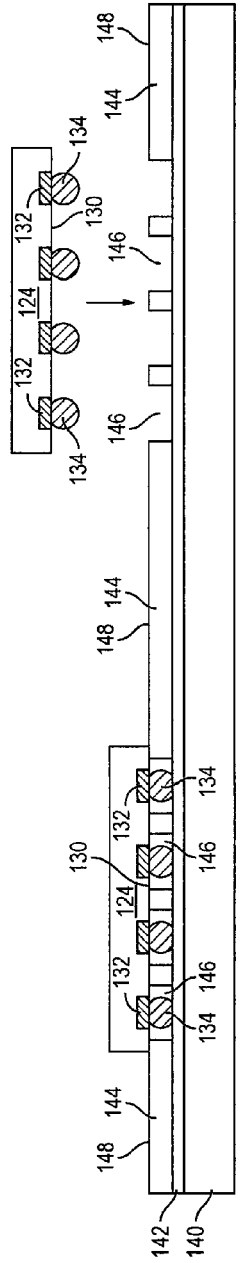
Figure 4D:
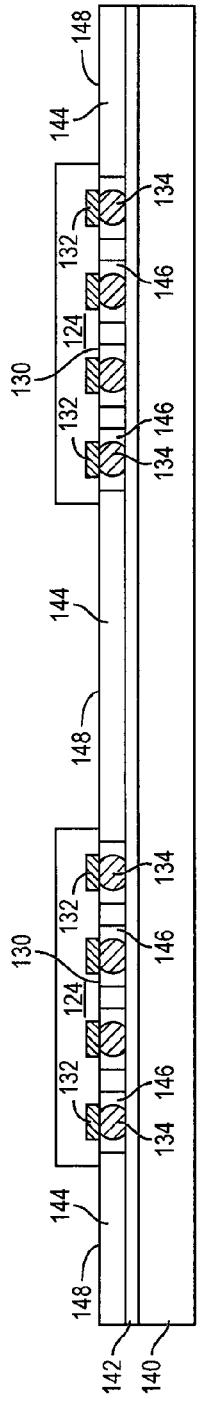

In FIG. 4c, semiconductor die 124 is mounted to carrier 140 using a pick and place operation such that bumps 134 are disposed partially or completely in openings 146 to reduce package height. The openings 146 also provide alignment marks for placement of semiconductor die 124. Active surface 130 is substantially even with top surface 148 of thermally conductive layer 144. FIG. 4d shows all semiconductor die 124 mounted to carrier 140 with bumps 134 disposed partially or completely within openings 146 of thermally conductive layer 144 and active surface 130 contacting portions of top surface 148 of thermally conductive layer 144 for efficient heat transfer.

Figure 4E:
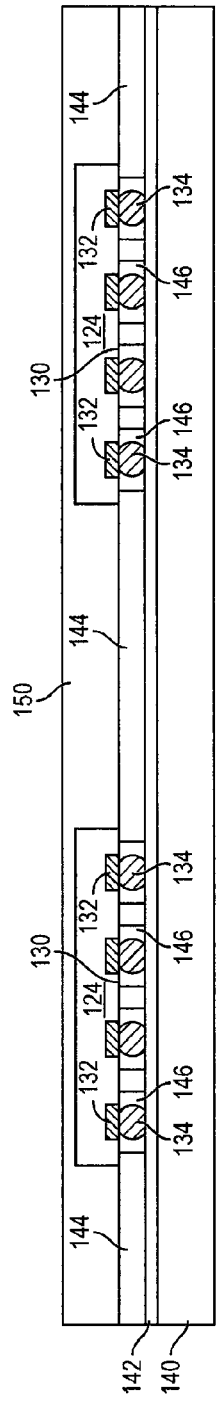

In FIG. 4e, an encapsulant or molding compound 150 is deposited over semiconductor die 124 and carrier 140 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants.

Figure 4F:
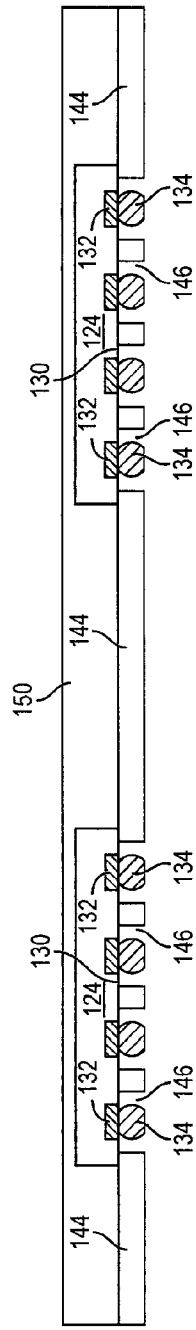

In FIG. 4f, temporary carrier 140 and interface layer 142 are removed by chemical etching, mechanical peel-off, CMP, mechanical grinding, thermal bake, UV light, laser scanning, or wet stripping. Bumps 134 are exposed from thermally conductive layer 144 following removal of carrier 140.

Figure 4G:
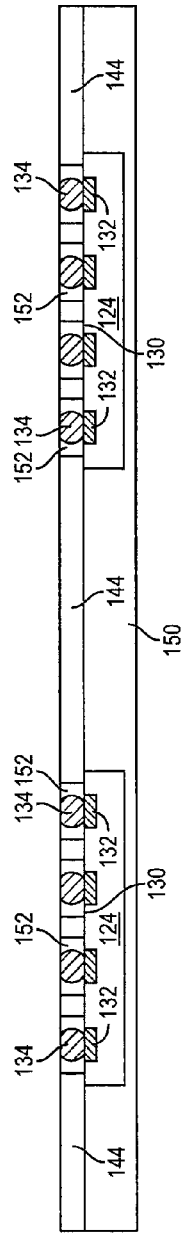

In FIG. 4g, the structure is inverted and an insulating or passivation layer 152 is formed in openings 146 around bumps 134 for electrical isolation. The insulating layer 152 contains one or more layers of silicon dioxide (SiO2), silicon nitride (Si3N4), silicon oxynitride (SiON), tantalum pentoxide (Ta2O5), aluminum oxide (Al2O3), organic materials, resin, or other material having similar insulating and structural properties. The insulating layer 152 is formed using screen printing, spin coating, spray coating, needle dispensing, or lamination. An optional grinding process can be preformed to planarize insulating layer 152 and expose bumps 134.

Figure 4H:
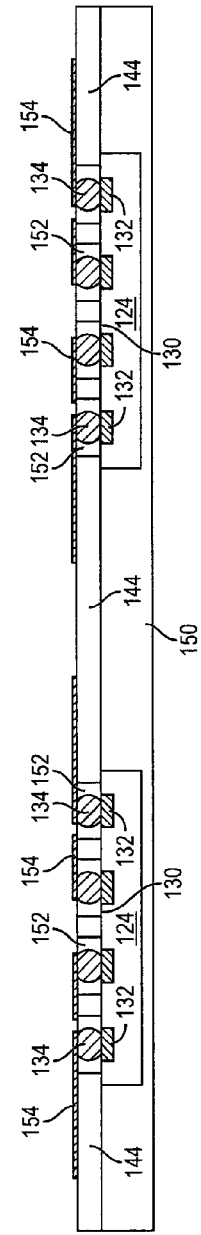

In FIG. 4h, an electrically conductive layer or redistribution layer (RDL) 154 is formed over thermally conductive layer 144, insulating layer 152, and bumps 134 using a patterning and metal deposition process such as sputtering, electrolytic plating, and electroless plating. Conductive layer 154 can be one or more layers of Al, Cu, Sn, Ni, Au, Ag, or other suitable electrically conductive material. One portion of conductive layer 154 is electrically connected to bumps 134. Other portions of conductive layer 154 can be electrically common or electrically isolated depending on the design and function of semiconductor die 124.

Figure 4I:
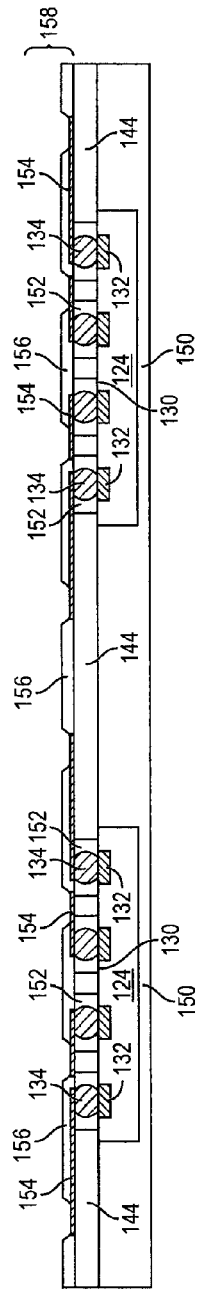

In FIG. 4i, an insulating or passivation layer 156 is formed over thermally conductive layer 144, insulating layer 152, and conductive layer 154. The insulating layer 156 contains one or more layers of SiO2, Si3N4, SiON, Ta2O5, Al2O3, organic materials, resin, or other material having similar insulating and structural properties. The insulating layer 156 is formed using screen printing, spin coating, spray coating, needle dispensing, or lamination. A portion of insulating layer 156 is removed by an etching process to expose conductive layer 154. The combination of insulating layers 152 and 156 and conductive layer 154 constitute build-up interconnect structure 158.

In FIG. 4j, an electrically conductive bump material is deposited over build-up interconnect structure 158 and electrically connected to the exposed conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 160. In some applications, bumps 160 are reflowed a second time to improve electrical contact to conductive layer 154. An under bump metallization (UBM) can be formed under bumps 160. The bumps can also be compression bonded to conductive layer 154. Bumps 160 represent one type of interconnect structure that can be formed over conductive layer 154. The interconnect structure can also use bond wires, stud bump, micro bump, or other electrical interconnect.

Semiconductor die 124 are singulated using saw blade or laser cutting tool 162 into individual FO-WLCSP 164. FIG. 5 shows FO-WLCSP 164 after singulation. Semiconductor die 124 is electrically connected through bumps 134 to interconnect structure 158 and bumps 160. Thermally conductive material 144, disposed between semiconductor die 124 and interconnect structure 158, provides heat dissipation from the semiconductor die to the interconnect structure. Active surface 130 contacts portions of top surface 148 of thermally conductive layer 144 for efficient heat transfer. Encapsulant 150 can be made thinner, which aids in heat dissipation. Thermally conductive material 144 has a CTE similar to the CTE of semiconductor die 124 and interconnect structure 158 to minimize thermal stress. Thermally conductive material 144 has a plurality of openings 146 to accommodate bumps 134 and reduce package height. The openings 146 also provide alignment marks for accurate placement of semiconductor die 124, which negates the need for precision die bonding equipment. In addition, disposing bumps 134 within openings 146 of thermally conductive layer 144 also reduces bump size and pitch, as well as minimizing bump collapse. The direct connection between bumps 134 and conductive layer 154 reduces interconnect resistance and improves electrical performance. Thermally conductive layer 144 securely holds semiconductor die 124 in place to reduce die shifting and warpage during encapsulation.

A thermally conductive layer to a flipchip type semiconductor die is also suitable in embedded wafer level ball grid array (eWLB) package to achieve finer pitch bumps over the semiconductor die.

Figure 6:
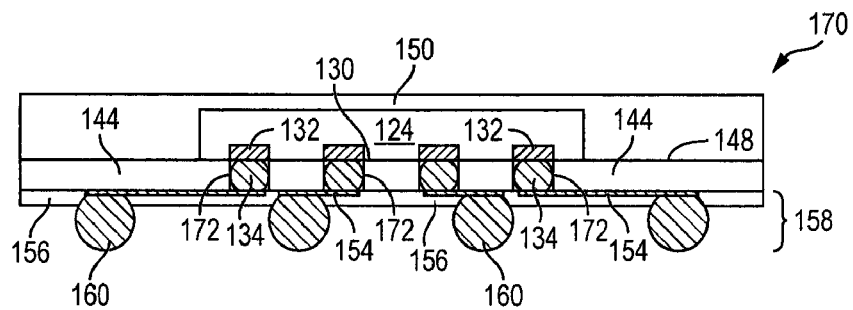
FIG. 6 illustrates the bumps contacting a sidewall of the thermally conductive layer.

FIG. 6 shows another embodiment of FO-WLCSP 170, similar to FIG. 5, with bumps 134 contacting a sidewall 172 of openings 146 in thermally conductive layer 144. The insulating layer 152 can be omitted in this embodiment.

Figure 7A:
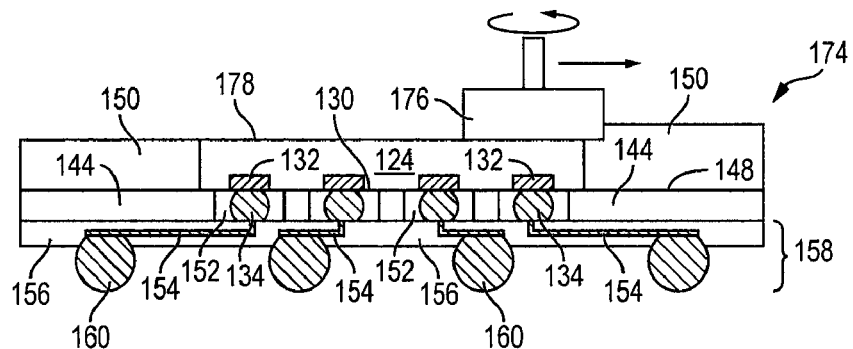
FIGS. 7a-7b illustrate the WLCSP with a back surface of the semiconductor die exposed.
Figure 7B:
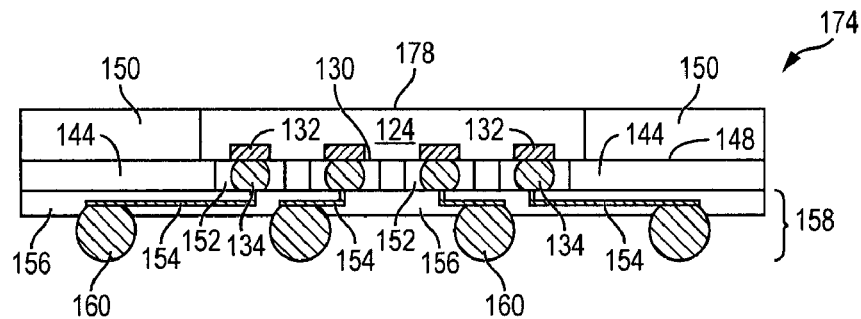

FIGS. 7a-7b show another embodiment of FO-WLCSP 174, similar to FIG. 5, with grinder 176 removing a portion of encapsulant 150 to expose back surface 178 of semiconductor die 124.

Figure 8:
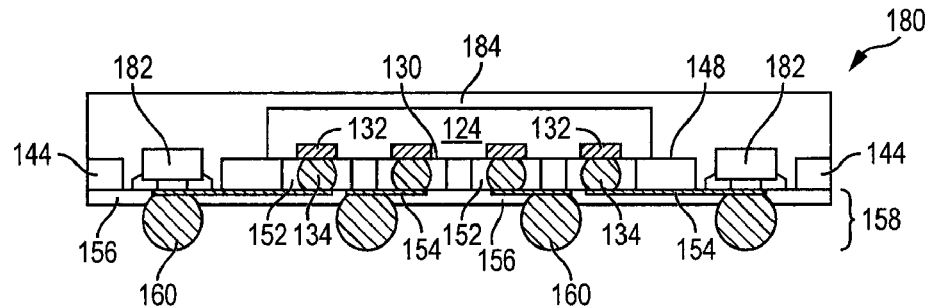
FIG. 8 illustrates discrete devices disposed within openings of the thermally conductive layer and electrically connected to the interconnect structure.

FIG. 8 shows another embodiment of FO-WLCSP 180, similar to FIG. 5, with discrete passive or active devices 182, such as inductor, capacitor, resistor, diode, or power transistor, disposed within openings formed in thermally conductive layer 144. The discrete devices 182 are electrically connected to conductive layer 154 of interconnect structure 158. An encapsulant or molding compound 184 is deposited over semiconductor die 124, discrete devices 182, and thermally conductive layer 144.

Figure 9:
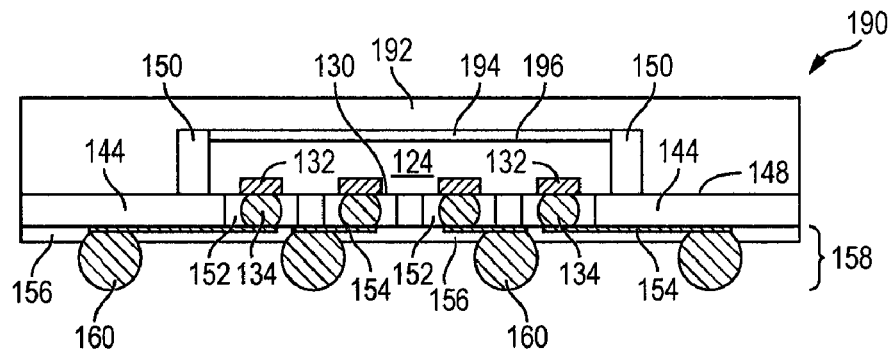
FIG. 9 illustrates a heat sink mounted over the semiconductor die.

FIG. 9 shows another embodiment of FO-WLCSP 190, similar to FIG. 5, with a heat sink 192 mounted over semiconductor die 124 and thermally conductive layer 144. Heat sink 192 extends down the sides of semiconductor die 124 to thermally conductive layer 144 for efficient heat transfer. Heat sink 192 can be Cu, Al, or other material with high thermal conductivity. A TIM 194 can be disposed between heat sink 192 and back surface 196 of semiconductor die 124 to aid with distribution and dissipation of heat generated by the semiconductor die. TIM 194 can be aluminum oxide, zinc oxide, boron nitride, or pulverized silver.

Figure 10:
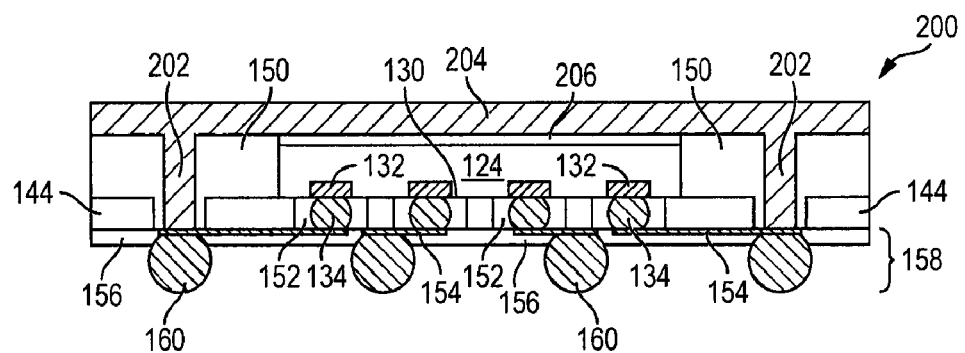
FIG. 10 illustrates a shielding layer formed over the semiconductor die and electrically connected to the interconnect structure through conductive pillars.

FIG. 10 shows another embodiment of FO-WLCSP 200, similar to FIG. 5, with a plurality of vias formed through encapsulant 150 around a periphery of semiconductor die 124 using mechanical drilling, laser drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form z-direction conductive pillars or vias 202. Alternatively, a plurality of stud bumps or solder balls can be formed within the vias. Conductive pillars or vias 202 extend down through openings formed in thermally conductive layer 144 to conductive layer 154 of interconnect structure 158.

A shielding layer 204 is formed over encapsulant 150 and conductive pillars or vias 202, for example at the wafer level. Shielding layer 204 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding layer 204 is patterned and conformally deposited using an electrolytic plating, electroless plating, sputtering, PVD, CVD, or other suitable metal deposition process. Shielding layer 204 can also be a non-metal material such as carbon-black or aluminum flake to reduce the effects of EMI and RFI. For non-metal materials, shielding layer 204 can be applied by lamination, spraying, or painting. An interposing insulating layer 206 is disposed between shielding layer 204 and semiconductor die 124. Shielding layer 204 is electrically connected through conductive pillars or vias 202 and interconnect structure 158 to an external low-impedance ground point.

Figure 11:
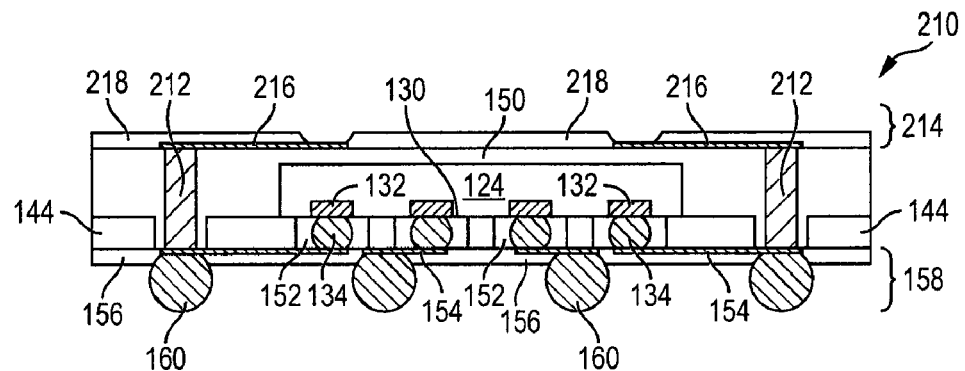
FIG. 11 illustrates an interconnect structure formed over the semiconductor die and electrically connected to the interconnect structure through conductive pillars.

FIG. 11 shows another embodiment of FO-WLCSP 210, similar to FIG. 5, with a plurality of vias formed through encapsulant 150 around a periphery of semiconductor die 124 using mechanical drilling, laser drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction conductive pillars or vias 212. Alternatively, a plurality of stud bumps or solder balls can be formed within the vias. Conductive pillars or vias 212 extend down through openings formed in thermally conductive layer 144 to conductive layer 154 of interconnect structure 158.

An interconnect structure 214 is formed over encapsulant 150 and conductive pillars or vias 212. The interconnect structure 214 includes an electrically conductive layer or RDL 216 formed using a patterning and metal deposition process such as sputtering, electrolytic plating, and electroless plating. Conductive layer 216 can be one or more layers of Al, Cu, Sn, Ni, Au, Ag, or other suitable electrically conductive material. One portion of conductive layer 216 is electrically connected to conductive pillars or vias 212. Other portions of conductive layer 216 can be electrically common or electrically isolated depending on the design and function of semiconductor die 124.

The interconnect structure 214 further includes an insulating or passivation layer 218 formed between conductive layers 216 for electrical isolation. The insulating layer 218 contains one or more layers of SiO2, Si3N4, SiON, Ta2O5, Al2O3, or other material having similar insulating and structural properties. The insulating layer 218 is formed using PVD, CVD, printing, spin coating, spray coating, sintering or thermal oxidation. A portion of insulating layer 218 is removed by an etching process to expose conductive layer 216 for bump formation or additional package interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a temporary carrier;
    forming a thermally conductive layer over the temporary carrier, the thermally conductive layer including electrically non-conductive material;
    forming a plurality of openings in the thermally conductive layer;
    providing a semiconductor die having a plurality of bumps formed over contact pads on the semiconductor die;
    mounting the semiconductor die over the thermally conductive layer so that the bumps are disposed at least partially within the openings in the thermally conductive layer;
    depositing an encapsulant over the semiconductor die and thermally conductive layer;
    removing the temporary carrier to expose the bumps; and
    forming a first interconnect structure over the encapsulant, semiconductor die, and bumps, the bumps being electrically connected to the first interconnect structure.

2. The method of claim 1, wherein the thermally conductive layer includes aluminum oxide, beryllium oxide, thermal interface material, bakelite, anodized aluminum sheet, or sheet of copper or aluminum with a thin insulating coating.

3. The method of claim 1, wherein forming the first interconnect structure includes:
    forming a first insulating layer in the openings of the thermally conductive layer around the bumps;
    forming a conductive layer over the first insulating layer and thermally conductive layer; and
    forming a second insulating layer over the conductive layer and first insulating layer.

4. The method of claim 1, wherein the bumps contact a sidewall of the openings in the thermally conductive layer.

5. The method of claim 1, further including removing a portion of the encapsulant to expose a back surface of the semiconductor die.

6. The method of claim 1, further including forming a heat sink over the semiconductor die.

7. The method of claim 1, further including:
    forming a plurality of conductive vias through the encapsulant; and
    forming a second interconnect structure over the encapsulant and semiconductor die opposite the first interconnect structure, the second interconnect structure being electrically connected to the first interconnect structure through the conductive vias.

8. A method of making a semiconductor device, comprising:
    providing a carrier;
    forming a thermally conductive layer having a plurality of openings over the carrier;
    providing a semiconductor die having a plurality of bumps formed over contact pads on the semiconductor die;
    mounting the semiconductor die over the thermally conductive layer so that the bumps are disposed within the openings in the thermally conductive layer;
    depositing an encapsulant over the semiconductor die and thermally conductive layer;
    removing the carrier; and
    forming a first interconnect structure over the encapsulant and semiconductor die, the bumps being electrically connected to the first interconnect structure.

9. The method of claim 8, wherein the thermally conductive layer includes electrically non-conductive material.

10. The method of claim 8, wherein the bumps contact a sidewall of the openings in the thermally conductive layer.

11. The method of claim 8, further including:
    forming a plurality of conductive vias through the encapsulant; and
    forming a shielding layer over the semiconductor die, the shielding layer being electrically connected to the first interconnect structure through the conductive vias.

12. The method of claim 8, further including forming a heat sink over the semiconductor die.

13. The method of claim 8, further including:
    forming a plurality of conductive vias through the encapsulant; and
    forming a second interconnect structure over the encapsulant and semiconductor die opposite the first interconnect structure, the second interconnect structure being electrically connected to the first interconnect structure through the conductive vias.

14. A method of making a semiconductor device, comprising:
    providing a thermally conductive layer having a plurality of openings;
    mounting a semiconductor die having a plurality of bumps over the thermally conductive layer so that the bumps are disposed within the openings in the thermally conductive layer;
    depositing an encapsulant over the semiconductor die and thermally conductive layer; and
    forming a first interconnect structure over the encapsulant and semiconductor die, the bumps being electrically connected to the first interconnect structure.

15. The method of claim 14, wherein the thermally conductive layer includes electrically non-conductive material.

16. The method of claim 14, wherein the thermally conductive layer includes aluminum oxide, beryllium oxide, thermal interface material, bakelite, anodized aluminum sheet, or sheet of copper or aluminum with a thin insulating coating.

17. The method of claim 14, wherein the bumps contact a sidewall of the openings in the thermally conductive layer.

18. The method of claim 14, further including:
    forming a plurality of conductive vias through the encapsulant; and
    forming a shielding layer over the semiconductor die, the shielding layer being electrically connected to the first interconnect structure through the conductive vias.

19. The method of claim 14, further including forming a heat sink over the semiconductor die.

20. The method of claim 14, further including:
   forming a plurality of conductive vias through the encapsulant; and
   forming a second interconnect structure over the encapsulant and semiconductor die opposite the first interconnect structure, the second interconnect structure being electrically connected to the first interconnect structure through the conductive vias.

21. A semiconductor device, comprising:
   a thermally conductive layer having a plurality of openings;
   a semiconductor die having a plurality of bumps mounted over the thermally conductive layer so that the bumps are disposed within the openings in the thermally conductive layer;
   an encapsulant deposited over the semiconductor die and thermally conductive layer; and
   a first interconnect structure formed over the encapsulant and semiconductor die, the bumps being electrically connected to the first interconnect structure.

22. The semiconductor device of claim 21, wherein the thermally conductive layer includes electrically non-conductive material.

23. The semiconductor device of claim 21, further including:
   a plurality of conductive vias formed through the encapsulant; and
   a shielding layer formed over the semiconductor die, the shielding layer being electrically connected to the first interconnect structure through the conductive vias.

24. The semiconductor device of claim 21, further including a heat sink mounted over the semiconductor die.

25. The semiconductor device of claim 21, further including:
   a plurality of conductive vias formed through the encapsulant; and
   a second interconnect structure formed over the encapsulant and semiconductor die opposite the first interconnect structure, the second interconnect structure being electrically connected to the first interconnect structure through the conductive vias.

* * * * *